United States Patent [19]
Benyon, Jr. et al.

[11] 3,749,984
[45] July 31, 1973

[54] ELECTROACOUSTIC SEMICONDUCTOR DEVICE EMPLOYING AN IGFET

[75] Inventors: Carl W. Benyon, Jr.; Donald Liebowitz, both of Trenton, N.J.

[73] Assignee: RCA Corporation, New York, N.Y.

[22] Filed: Apr. 11, 1969

[21] Appl. No.: 815,304

[52] U.S. Cl. ............. 317/235 R, 307/303, 307/304, 307/308, 333/30, 333/72, 317/235 G, 317/235 M, 317/235 B

[58] Field of Search ............................... H011/19/00; 317/235 M, 235 B, 235 A; 333/30 R; 334/15

[56] References Cited

UNITED STATES PATENTS

| | | | |
|---|---|---|---|
| 3,329,023 | 7/1967 | Kurtz et al. | 317/235 |
| 3,360,749 | 12/1967 | Sittig | 317/235 |
| 3,413,573 | 11/1968 | Nathanson et al. | 317/235 |
| 3,473,032 | 10/1969 | Lehovec | 317/235 |
| 3,479,572 | 11/1969 | Pokorny | 317/234 |
| 3,486,046 | 12/1969 | Zalar | 317/234 |

*Primary Examiner*—John W. Huckert
*Assistant Examiner*—William D. Larkins
*Attorney*—Glenn H. Bruestle

[57] ABSTRACT

An electroacoustic semiconductor device, comprising a direct-coupled piezoelectric transducer with interdigitated electrodes, and an insulated gate field-effect transistor fabricated on a layer of semiconductor material having a surface insulating coating, a part of which serves as the gate insulator of the transistor. An input signal applied to the interdigitated electrodes causes the transducer to launch a surface acoustic wave along the insulating coating, with a resultant change in gate electrode insulator thickness, thus controlling current flow between source and drain electrodes.

7 Claims, 6 Drawing Figures

INVENTORS
CARL W. BENYON, JR. &
DONALD LEIBOWITZ

BY [signature]
Attorney

INVENTORS
CARL W. BENYON, JR. &
DONALD LEIBOWITZ

BY [signature]
Attorney

ELECTROACOUSTIC SEMICONDUCTOR DEVICE EMPLOYING AN IGFET

BACKGROUND OF THE INVENTION

The present invention relates to semiconductor devices which utilize the surface acoustic wave properties of piezoelectric materials for controlling signal translating devices.

Several methods have previously been proposed for controlling current flow in insulated gate field-effect transistors. One such method employed an encapsulated liquid metal gate electrode which was sensitive to temperature variations; another method utilized a gate electrode attached to a movable metallic tape. Both of the aforementioned methods are described in U.S. Pat. No. 3,356,915. Still another method proposed the use of a gate electrode comprising a cantilevered resonant metallic beam; this method is described in *Solid State Technology* magazine, p. 39, March, 1968. Previous methods known in the art, however, suffered severe size, sensitivity, and frequency limitations.

OBJECTS OF THE INVENTION

An object of the present invention is to provide a novel means for controlling the current flow in an insulated gate field-effect transistor.

Another object of the present invention is to provide an improved method for controlling the current flow in an insulated gate field-effect transistor.

SUMMARY OF THE INVENTION

The present invention comprises a semiconductor device having a layer of semiconductor material; disposed on a major surface of the layer is a continuous insulating coating, and formed within the layer is at least one insulated gate field-effect transistor. The transistor is disposed such that the gate electrode insulator comprises a portion of the continuous surface insulating coating. The device has means for launching a surface acoustic wave along said coating into the region of the gate insulator, thus providing a means for modulating the gate electrode of the transistor.

The present invention also provides a method for controlling the current flow in an insulated gate field-effect transistor. The method comprises biasing the transistor into an operating condition, or to the threshold of an operating condition, and then propagating a surface acoustic wave into the region of the gate insulator, thus modulating the thickness of said insulator. The modulation of the gate insulator causes commensurate capacitive changes between the gate electrode and the substrate, thereby controlling current flow between source and drain electrodes of the transistor.

A technical treatment of surface acoustic waves was presented by R. M. White, *IEEE Trans. Electron Devices*, Vol. Ed-14, No. 4, p. 181, April 1967. A discussion of electroacoustic devices appeared in *Microwave* magazine, p. 14 and 21, November 1968.

The possible applications of a device constructed in accordance with the present invention are numerous. For instance, the device may be employed as a narrow bandwidth filter or attenuator for integrated circuit devices. Such a filter provides a resonant integrated circuit that eliminates the undesirable effects of inductive devices. In addition, the fabrication of the device is compatible with existing integrated circuit technology. Further, the device of the present invention may be employed as a television tuner, a phase shifter, a timer, or as a delay line.

THE DRAWING

FIG. 1 is a partially cut away perspective view of a device constructed in accordance with the present invention.

FIG. 1*a* is an output voltage versus frequency characteristic curve, when an enhancement-type insulated gate field-effect transistor is utilized in the invention as shown in FIG. 1.

FIG. 1*b* is an output voltage versus frequency characteristic curve, when a depletion-type insulated gate field-effect transistor is employed in the invention as shown in FIG. 1.

DETAILED DESCRIPTION

Figure 1:
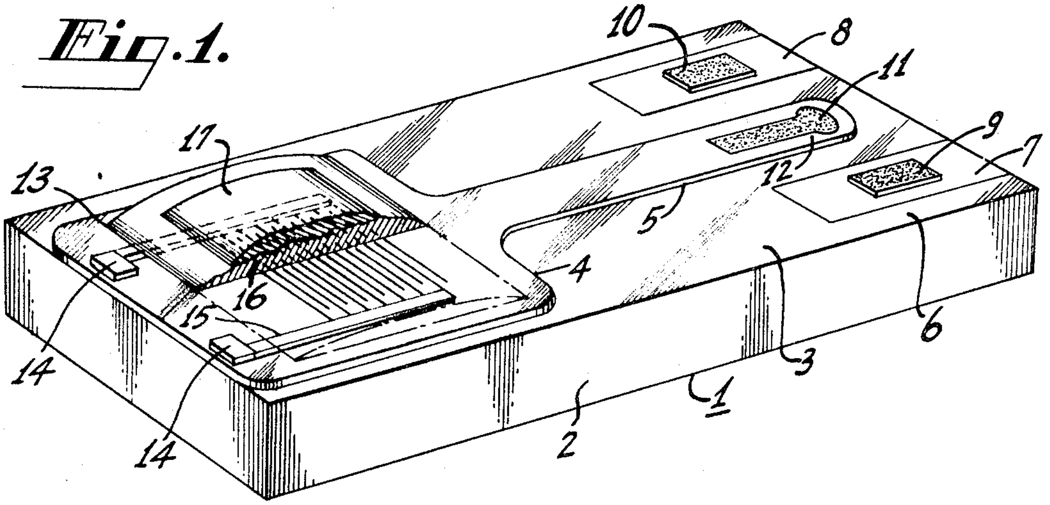

A preferred embodiment of the device according to the present invention will now be described with reference to FIG. 1.

The device includes a transducer, an insulated gate field-effect transistor and means connecting the two components. The device 1 comprises a layer of semiconductor material 2, preferably p-type silicon, having a major surface 3. A continuous insulating coating is disposed on the major surface 3, comprising an insulating film 4 disposed on one end of the surface 3, and an acoustic wave propagation path 5, which is disposed along the surface 3 from the insulating film 4 to the opposite end of said surface. Preferably, the insulating film 4 and the propagation path 5 are of uniform thickness, and must be mutually continuous. The thickness of the insulating film 4 and propagation path 5 is not critical, but a thickness of between 0.5 and 1.5 microns is preferred. The width of the propagation path 5 is also not critical, but dimensions between 2 mils and 5 mils are desirable for integrated circuit application.

An insulated gate field-effect transistor 6 is fabricated into the layer 2 on the end opposite the insulating film 4. The transistor 6 comprises n-type source and drain diffusion regions 7 and 8 and metallic source, drain, and gate electrodes 9, 10, and 11. The gate electrode 11 is disposed on the surface of the propagation path 5; thus, that portion of the path underneath the gate electrode 11 provides a gate electrode insulator 12 which is mutually continuous with the propagation path 5 and the insulating film 4.

Further, a direct coupled piezoelectric transducer 13 is disposed on the insulating film 4 to provide a means for launching surface acoustic waves. The transducer 13 has input terminal pads 14 connected to interdigitated electrodes 15, both of which are deposited on the surface of the insulating film 4. The width of each interdigitated electrode 15 is one-quarter wavelength, and the spacing from centerline-to-centerline of adjacent electrodes is one-half wavelength, said wavelength being determined by the desired center frequency of operation, and the velocity of sound in the piezoelectric transducer 13 in a manner hereinafter described.

The transducer 13 also has a thin film of piezoelectric material 16 disposed onto and contiguous with the interdigitated electrodes 15 and the insulating film 4; thicknesses of between 4.0 and 5.0 microns for the piezoelectric film 16 are preferred. In FIG. 1, a portion of the piezoelectric film 16 is cut away to show the positioning of the interdigitated electrodes 15.

A metallic ground plane electrode 17 is disposed over that area of the piezoelectric film 16 which covers the interdigitated electrodes 15; this ground plane electrode 17 serves to contain electromagnetic coupling within the transducer 13.

A method for fabricating the device of the present invention will be described with reference to FIG. 1. A p-type silicon layer 2 formed by conventional crystal growth or the "float zone" process, is provided with n-type source and drain diffusion regions 7 and 8. These diffusion regions 7 and 8 are formed by depositing silicon dioxide doped with phosphorus over the desired source and drain diffusion areas 7 and 8 of the layer 2, and then heating the silicon layer 2 in a diffusion furnace for 15 minutes at 1,100° C.

Thereafter, a continuous surface coating consisting of either silicon dioxide, silicon nitride or aluminum oxide is deposited onto the major surface 3 of the silicon layer 2. A silicon dioxide or silicon nitride surface coating may be deposited by evaporation, thermal growth, or cathode sputtering; however, the thermal growth technique is preferred. An aluminum oxide surface coating may be provided by first depositing a thin film of aluminum on the layer 2 by evaporation, and then anodizing the aluminum layer in a plasma of oxygen. The surface coating is then coated with a film of photoresist, exposed to a suitable opaque pattern, developed and etched to provide the insulating film 4, the surface acoustic wave propagation path 5, and the gate electrode insulator 12, which are mutually continuous and have a uniform thickness of between 0.5 and 1.5 microns.

Aluminum is then deposited by evaporation onto the source and drain diffusion regions 7 and 8 to provide source and drain electrodes 9 and 10, and onto the gate insulator 12 to provide a gate electrode 11.

The interdigitated electrodes 15 and the input terminal pads 14 are then formed on the insulating film 4 in the following manner. A layer of gold is deposited over a thin layer of chromium by continuous process in a dual evaporation vacuum system. The thickness of the chromium layer is about 100–200 A and the thickness of the gold layer is about 4,800–4,900A, so that the total metallic deposition is about 5,000A thick. The interdigitated electrode 15 pattern and the input terminal pads 14 may then be produced by standard photoresist-etch techniques.

Aluminum or tungsten deposited by standard vapor techniques may be also used in the fabrication of the interdigitated electrodes 15; however, the gold-chromium combination is preferred.

Thereafter, a cadmium sulfide film 16 is deposited over the interdigitated electrodes 15 and the insulating film 4. One method of forming the cadmium sulfide film 16 is by simultaneous evaporation of cadmium sulfide and sulfur in the manner described by J. De Klerk and E. Kelly, in *Review of Scientific Instruments*, vol. 36, No. 4, 506, April 1965. However, we prefer to employ the "three temperature" process which is described as follows.

Powdered sulfur and cadmium, in individual crucibles, are placed in a reaction chamber inside a vacuum system. Each crucible is fitted with heating coils, and the two crucibles are spaced apart to allow each to be heated at different temperatures. A clean semiconductor layer and means for heating same is placed in a glass chamber above the crucibles. The layer is maintained at a temperature between 175° to 185° C. during deposition of the film.

The sulfur is then heated to a crucible temperature between 150° C. and 170° C., and the cadmium is heated to a crucible temperature between 400° C. and 420° C. until a cadmium sulfide film begins forming on the walls of the reaction chamber. A shutter over an aperture in the bottom of the glass chamber is then opened, allowing the cadmium sulfide film to be deposited on the semiconductor layer. Film deposition rate varies from 500A/min to 4,000A/min, and is controlled by the heat supplied to the cadmium crucible. Optimum cooling rate of the film and layer is 25° per hour, in order to prevent film cracking.

A gold ground plane electrode 17 is then deposited directly onto the cadmium sulfide film 16 by evaporation, having a thickness of about 800A.

Figure 2:
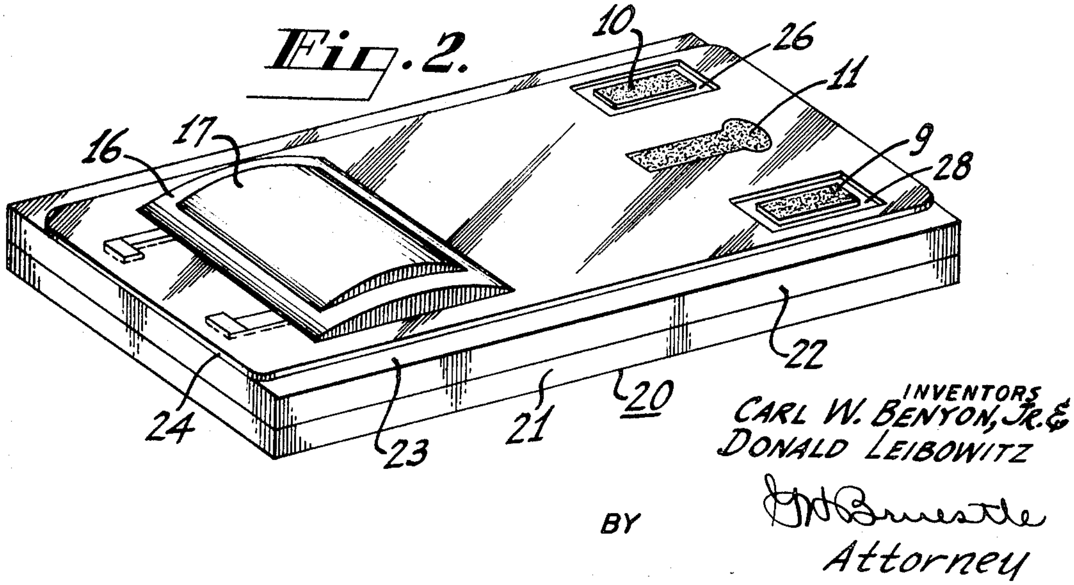
FIG. 2 is a perspective view of an alternate form of the device of the present invention.

In addition, the semiconductor layer and the continuous surface coating may be fabricated in an alternate manner, which will be described with reference to FIG. 2. The device 20 includes a substrate of nonsemiconducting material 21 which is preferably sapphire or magnesium alumina spinel. A single crystal of silicon 22 having a major surface 23 is formed on the surface of the nonsemiconducting material 21 by thermal growth, in which silane gas is passed over the hot substrate in a crystal oven at a temperature of 750° C.

An insulating coating 24 is then disposed over the entire major surface 23 of the silicon layer 22, and source and drain "windows" 25 and 26 are etched into the insulating coating 24 to allow deposition of the gold source and drain electrodes 9 and 10 by direct evaporation. The gate electrode 11, transducer 13, and ground plane electrode 17 are then fabricated in the manner previously described.

The novel means and method by which the device of the present invention controls the current flow in an insulated gate field-effect transistor will now be illustrated by way of examples, in which the operation of the device as a narrow bandwidth filter or attenuator, as a television tuner, and as a timer, is described.

EXAMPLE ONE

A narrow band filter constructed in accordance with the present invention will be described with reference to FIG. 1. Operation of the device 1 as a narrow bandpass filter is initiated when an electronic signal containing a broad frequency spectrum and the center frequency of the narrow bandpass is impressed on the terminal pads 14 and thus to the interdigitated electrodes 15. The narrow bandpass center frequency is selected by proper fabrication of the interdigitated electrodes 15, based upon the relationship between the velocity of sound in the cadmium sulfide film 16 and the spacing between adjacent electrodes 15, as given by the expression $$f = c/2s$$

where $f$ = desired center frequency of the bandpass $c$ = velocity of sound in cadmium sulfide film $s$ = spacing between centerlines of adjacent electrodes.

Thus, a filter constructed in accordance with the present invention will select only that component of the input signal to the terminal pads 14 which is at the designed center frequency.

Once the center frequency is applied to the transducer 13, electromagnetic coupling is established between adjacent interdigitated electrodes 15 and through the cadmium sulfide film 16. The ground plane electrode 17 provides more efficient coupling by containing the electromagnetic field within the cadmium sulfide film 16, thus reducing coupling losses in space.

The continuous coupling of the electromagnetic field through the cadmium sulfide film 16 creates a mechanical vibration in the film due to its piezoelectric characteristics, in a well-known manner; the frequency of the vibration is thus equal to the frequency as determined by the design of the interdigitated electrodes 15 in the manner previously described.

Because the cadmium sulfide film 16 is contiguous with the insulating film 4, the transducer 13 launches a surface acoustic wave along the surface coating in the region of the insulating film 4. In a manner analogous to surface ripples on a body of water, the acoustic wave disperses along the propagation path 5 into the region of the gate electrode insulator 12. After a brief period of time, a standing acoustic wave appears along the transducer 13 and the entire surface coating 4, 5 and 12. The standing acoustic wave causes changes in the gate insulator 12 thickness, resulting in a commensurate change in the capacitance between the gate electrode 11 and the silicon layer 2. If, prior to the launch phase of the acoustic wave, the gate electrode 11 is forward biased to a threshold voltage which just prevents current flow between source and drain 7 and 8, then after the acoustic standing wave is established the capacitive swing decreases the effect of the threshold gate biasing, thus allowing current flow between source and drain 7 and 8. For example, we have found that gate insulator thickness changes of 100A for an insulator initially 1,000A thick produces insulator capacitance changes of 10 percent, which in turn is observed in the transistor output in the manner previously described. It should be noted that the velocity of the surface acoustic wave in the cadmium sulfide film 16 is less than in the silicon dioxide coating 4, 5, and 12, since the surface velocity of sound in CdS is $1.7\times10^5$ cm.sec$^{-1}$, and in $SiO_2$ is approximately $4.0\times10^5$ cm.sec$^{-1}$. However, the frequency of the surface acoustic wave is consistent to the input frequency along the entire device 1; therefore, the frequency at which the gate electrode 11 is modulated is always a frequency in the bandpass.

Figure 1A:
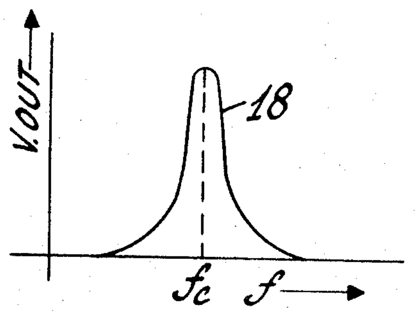

In operation of the device as a bandpass filter, the use of an enhancement-type insulated gate field-effect transistor is contemplated. Thus, with the gate electrode forward biased to threshold, no current flows between source and drain until an electronic signal of a frequency in the designed bandpass appears on the input terminals. In FIG. 1*a*, a representative voltage output versus frequency characteristic curve 18 is shown for a filter employing the present invention with an enhancement-type transistor; the dotted line represents the center frequency of the narrow bandpass.

Figure 1B:
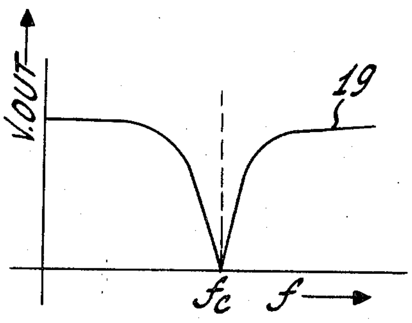

In addition, however, the filtering device of the present invention may be used as a narrow band attenuator by employing a depletion-type insulated gate field-effect transistor, in which the gate electrode is reverse biased to a threshold voltage which barely sustains current flow between source and drain. Thereafter, a change in insulator gate thickness decreases the effect of the threshold gate bias, preventing current flow between source and drain. In FIG. 1*b*, a voltage output versus frequency characteristic curve 19 is shown for an attenuation device employing the present invention with a depletion-type insulated gate field-effect transistor; the dotted line represents the center frequency of attenuation.

It will also be appreciated that a plurality of insulated gate field-effect transistors may be fabricated in the same layer of semiconductor material, and controlled in the manner previously described.

EXAMPLE TWO

Figure 3:
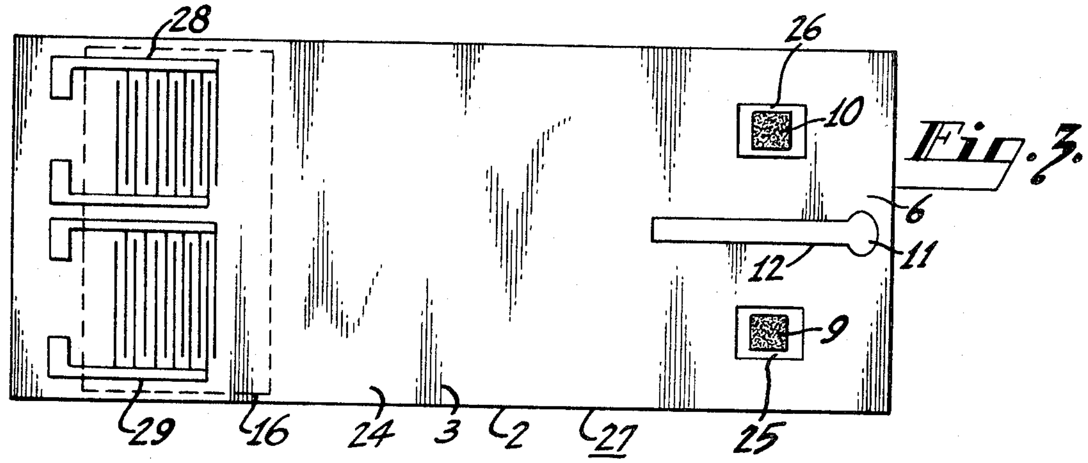
FIG. 3 is a top view of a television tuner constructed in accordance with the present invention, with part of the device omitted.

A television tuner constructed in accordance with the present invention will be described with reference to FIG. 3, which illustrates a top view of the device 27; the dotted line represents the area covered by the cadmium sulfide film 16, which has been omitted to show the positioning of the interdigitated electrodes 28 and 29.

The device 27 is fabricated as a television tuner in a manner previously described, except that two pairs of interdigitated electrodes 28 and 29 are disposed onto the insulating film 24 which is disposed over the entire surface 3 of the silicon layer 2. Source and drain "windows" 25 and 26 are etched into the insulating film 24 to allow deposition of the source and drain electrodes 9 and 10. The interdigitated electrodes 28 and 29 are covered with a film of cadmium sulfide 16 (represented by the dotted line). Disposed into the silicon layer 2 at the opposite end from the interdigitated electrodes 28 and 29, is an insulated gate field-effect transistor 6 which is of the enhancement type. The transistor 6 is forward biased on the gate electrode 11 to a threshold voltage which just prevents current flow between the source and drain electrodes 9 and 10.

One pair of the interdigitated electrodes 28 is disposed in the manner previously described, so that the electrodes 28 will only operate when a signal at the transmission frequency of the desired television channel is applied. The second pair of interdigitated electrodes 29 is disposed in a like manner, and is designed to operate at the frequency of the local oscillator of the television receiver. The transistor 6 comprises the signal translating device in the first stage of the i.f. circuitry; that is, the transistor will only operate in the intermediate frequency range of the television receiver.

After a signal at the channel transmission frequency is applied to the first pair of interdigitated electrodes 28, and the local oscillator signal is applied to the second pair of electrodes 29, an acoustic standing wave appears along the insulating film 24 and the gate electrode insulator 12. Four frequencies are contained in the standing wave; the channel transmission frequency, the local oscillator frequency, and the sum and difference of the first two frequencies. However, the difference frequency is the only frequency that appears in the intermediate frequency range, and therefore is the only frequency at which the gate electrode 11 is modulated, thus allowing current flow between source and drain electrodes 9 and 10 at the desired intermediate frequency.

Such a device provides a television tuner that obviates the need for inductive devices, and can be constructed to integrated circuit dimensions. It will be appreciated that a plurality of pairs of interdigitated electrodes may be fabricated on the same layer of semiconductor material, with each pair of electrodes designed to operate at a different television receiver channel frequency; thus, the entire tuner for a television receiver may be fabricated in one semiconductor layer.

EXAMPLE THREE

An integrated circuit timing device constructed in accordance with the present invention will be described with reference to FIG. 4. The device includes a plurality of insulated gate field-effect transistors disposed along a propagation path which connects each transistor gate electrode in a series arrangement a precise distance apart.

The device 30 is fabricated in the manner previously described, except that a plurality of insulated gate field-effect transistors 31, 32, 33, 34, 35 and 36 are disposed into the silicon layer 2 along the propagation path 37 in such a manner that each transistor gate electrode 38, 39, 40, 41, 42 and 43 is positioned a precise distance from adjacent gate electrodes and from the transducer 13. Each transistor 31–36 is forward biased to a threshold voltage which just prevents current flow between source and drain. The precise distance between adjacent gate electrodes 38–43 depends on the desired timing interval and the number of transistors, in a manner hereinafter described.

Figure 4:
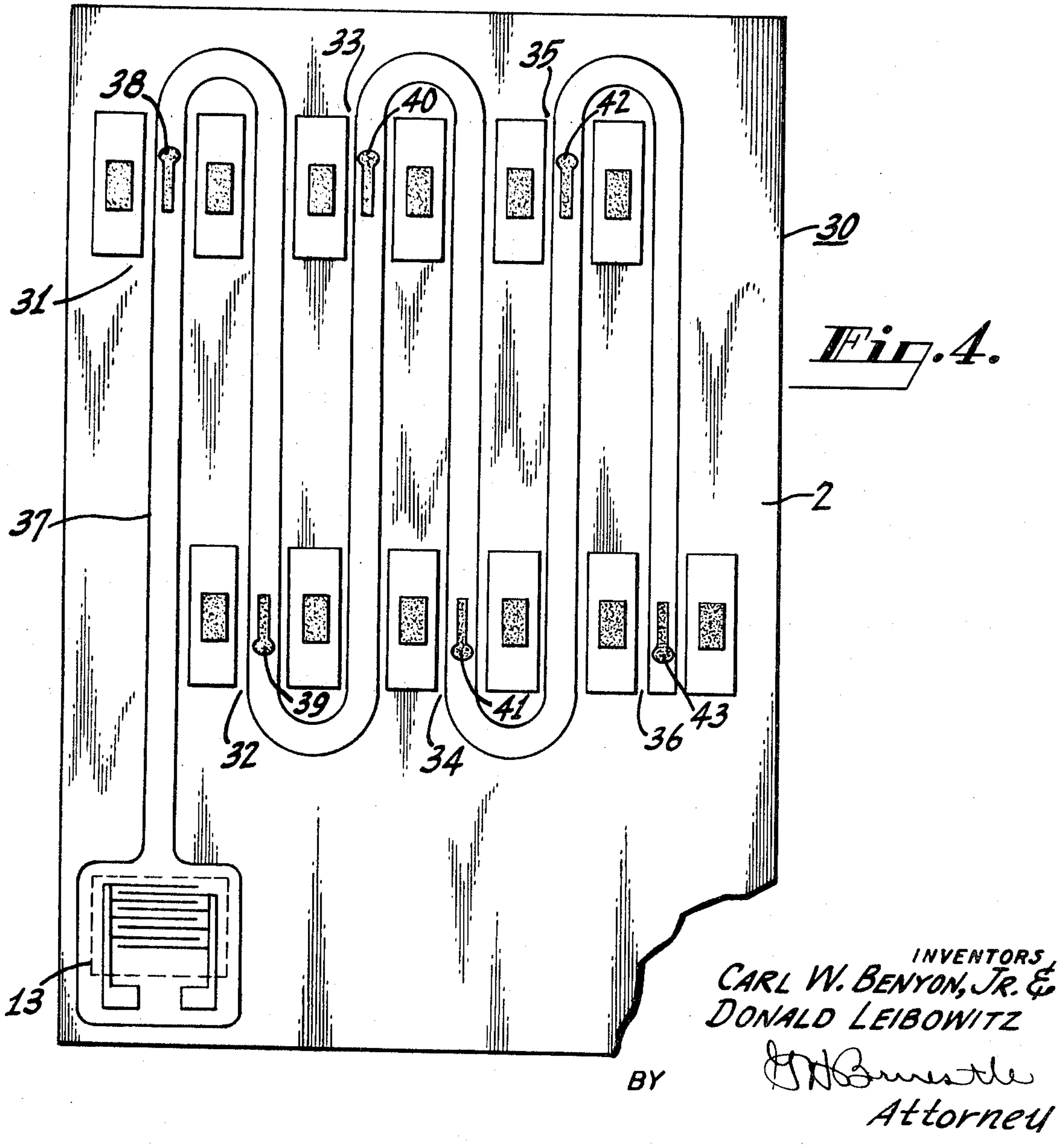
FIG. 4 is a top view of a timing device constructed in accordance with the present invention with part of the device omitted.

The propagation path 37 may be disposed in a straight pattern as previously described; however, it is desirable to employ a circuitous path, as shown in FIG. 4, in order to confine the device 30 to integrated circuit dimensions. A circuitous propagation path 37 may contain as many curves in the path as the timing application may require without unduly affecting the device efficiency; the only limitation on the shape of the path is that no sharp angles be formed, to prevent undesirable acoustic wave reflections.

For example, consider an application in which the timing device 30 will be employed to measure the time interval of d.c. pulses that do not exceed 0.6 microseconds duration. As shown in FIG. 4, the device 30 might contain six transistors 31–36, each representing a time interval of 0.1 microseconds. The cadmium sulfide transducer 13 may then be designed to operate at any frequency which is a fourier component of the d.c. pulse and is compatible with the terminal time display equipment; for instance, a frequency of 100 megahertz is desirable. The velocity of sound in the silicon dioxide coating which comprises the propagation path 37 is approximately $4.0 \times 10^5$ cm.sec.$^{-1}$; and at a frequency of 100 megahertz, one wavelength is about 40 microns long, or 0.01 microseconds in duration. Therefore, to provide for a 0.1 microsecond time interval, the first gate electrode 38 must be deposited about 10 wavelengths, or 400 microns, along the propagation path 37 from the transducer 13. The second gate electrode 39 is then deposited 400 microns from the first gate electrode 38 along the path 37, and so on. Exact calibration of the timing interval is more accurately facilitated during actual fabrication of the device 30.

Thereafter, when an acoustic wave of, for instance, 0.2 microseconds duration is launched along the propagation path 37, current flow between source and drain only occurs in two transistors at any one time; these currents are then summed and applied to a time display device to indicate a pulse duration of 0.2 microseconds.

It will be appreciated that the resolution of the timing interval may be increased by using a greater number of transistors, by using a lower transducer operating frequency, or by using a silicon nitride or aluminum oxide insulating coating.

What is claimed is:

1. A semiconductor device comprising:

a layer of semiconductor material having a continuous insulating coating disposed on a surface thereof, at least one insulated gate field-effect transistor formed within said layer, in which the gate insulation of said transistor comprises a portion of said coating, and means mounted on said coating for launching a surface acoustic wave along said coating, said last named means comprising at least one pair of interdigitated electrodes disposed on the continuous surface insulating coating and a film of piezoelectric material disposed over, and contiguous with, said electrodes and said coating.

2. A device according to claim 1, in which said electrodes comprise gold disposed over a thin layer of chromium.

3. A device according to claim 1, in which said electrodes comprise aluminum.

4. A device according to claim 1, in which said electrodes comprise tungsten.

5. A device according to claim 1, in which said piezoelectric material comprises cadmium sulfide.

6. A semiconductor device comprising:

a layer of semiconductor material having a continuous insulating coating disposed on a major surface thereof, an insulated gate field-effect transistor formed within said layer, in which the gate insulation of said transistor comprises a portion of said coating, first means mounted on said coating for launching a first surface acoustic wave along said coating, and second means mounted on said coating for launching a second surface acoustic wave along said coating.

7. A electroacoustic semiconductor tuner for a television receiver, comprising:

a layer of semiconductor material having a continuous insulating coating disposed on a surface thereof;

an insulated gate field-effect transistor formed within said layer, in which the gate insulation of said transistor comprises a portion of said coating;

first means mounted on said coating for launching a first surface acoustic wave along said insulating coating, said means operating only upon application of the transmission frequency of a desired television channel; and second means mounted on said coating for launching a second surface acoustic wave along said coating, said means operating only upon application of the local oscillator frequency of said television receiver.

* * * * *